US011756977B2

(12) United States Patent
Gambino et al.

(10) Patent No.: US 11,756,977 B2
(45) Date of Patent: Sep. 12, 2023

(54) BACKSIDE ILLUMINATION IMAGE SENSORS

(71) Applicant: SEMICONDUCTOR COMPONENTS INDUSTRIES, LLC, Phoenix, AZ (US)

(72) Inventors: Jeffrey Peter Gambino, Gresham, OR (US); Rick Jerome, Washougal, WA (US); David T. Price, Gresham, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 751 days.

(21) Appl. No.: 16/014,359

(22) Filed: Jun. 21, 2018

(65) Prior Publication Data

US 2019/0393257 A1    Dec. 26, 2019

(51) Int. Cl.
*H01L 27/146* (2006.01)
*H01L 23/532* (2006.01)

(52) U.S. Cl.
CPC .. *H01L 27/14636* (2013.01); *H01L 23/53266* (2013.01); *H01L 27/1462* (2013.01); *H01L 27/1463* (2013.01); *H01L 27/1464* (2013.01)

(58) Field of Classification Search
CPC .......... H01L 27/14636; H01L 27/1464; H01L 23/53266; H01L 27/1462; H01L 27/1463; H01L 23/481
See application file for complete search history.

(56) References Cited

U.S. PATENT DOCUMENTS

| | | | |
|---|---|---|---|
| 6,583,030 B1 | 6/2003 | Grassl | |
| 7,265,402 B2 | 9/2007 | Koyanagi | |
| 7,582,502 B1 | 9/2009 | Hwang et al. | |
| 8,030,726 B2 | 10/2011 | Sumi | |
| 8,420,434 B2 | 4/2013 | Yamamoto et al. | |
| 9,252,080 B1 * | 2/2016 | Couture ............ | H01L 21/76834 |
| 2006/0071152 A1 | 4/2006 | Ono | |
| 2008/0308893 A1 | 12/2008 | Kirby et al. | |
| 2009/0134500 A1 | 5/2009 | Kuo | |
| 2009/0140395 A1 | 6/2009 | Davis et al. | |
| 2010/0187671 A1 | 7/2010 | Lin et al. | |
| 2012/0112322 A1 | 5/2012 | Lin et al. | |
| 2012/0205791 A1 | 8/2012 | Su et al. | |

(Continued)

FOREIGN PATENT DOCUMENTS

DE    102008051930 A1    2/2010
DE    112008001588 B4    1/2019

OTHER PUBLICATIONS

Search Report, German Patent Application No. 102019116605.5, dated Feb. 21, 2020, 7 pages.

*Primary Examiner* — Samuel Park
(74) *Attorney, Agent, or Firm* — Adam R. Stephenson, LTD.

(57) ABSTRACT

Implementations of image sensor devices may include a through-silicon-via (TSV) formed in a backside of an image sensor device and extending through a material of a die to a metal landing pad. The metal landing pad may be within a contact layer. The devices may include a TSV edge seal ring surrounding a portion of the TSV in the contact layer and extending from a first surface of the contact layer into the contact layer to a depth coextensive with a depth of the TSV.

11 Claims, 3 Drawing Sheets

(56) References Cited

U.S. PATENT DOCUMENTS

| | | | |
|---|---|---|---|
| 2013/0105667 A1* | 5/2013 | Kobayashi | H01L 27/14634 250/208.1 |
| 2013/0154112 A1* | 6/2013 | Zhang | H01L 23/49827 257/774 |
| 2015/0008555 A1* | 1/2015 | Mizuta | H01L 27/14634 257/432 |
| 2015/0041781 A1* | 2/2015 | Hatano | H01L 27/307 257/40 |
| 2015/0187733 A1* | 7/2015 | Batra | H01L 24/32 257/621 |
| 2015/0221695 A1* | 8/2015 | Park | H01L 21/76898 257/774 |
| 2017/0213860 A1* | 7/2017 | Ukigaya | H01L 27/14621 |

* cited by examiner

BACKSIDE ILLUMINATION IMAGE SENSORS

BACKGROUND

1. Technical Field

Aspects of this document relate generally to image sensors, such as backside illumination image sensors. More specific implementations involve backside illumination sensors having a through-silicon-via.

2. Background

Image sensors convey information related to an image by communicating signals in response to incident electromagnetic radiation. Image sensors are used in a variety of devices including smart phones, digital cameras, night vision devices, medical imagers, and many others. Backside illumination image sensors may be used to improve the light receiving efficiency of the image sensor, particularly for specific light wavelengths.

SUMMARY

Implementations of image sensor devices may include a through-silicon-via (TSV) formed in a backside of an image sensor device and extending through a material of a die to a metal landing pad. The metal landing pad may be within a contact layer. The devices may include a TSV edge seal ring surrounding a portion of the TSV in the contact layer and extending from a first surface of the contact layer into the contact layer to a depth coextensive with a depth of the TSV.

Implementations of image sensor devices may include one, all, or any of the following:

The TSV edge seal ring may include tungsten.

The TSV edge seal ring may be physically isolated from the metal landing pad.

The device may include a pinning layer directly coupled to one or more sidewalls of the TSV.

The device may include an anti-reflective layer coupled to one or more sidewalls of the TSV.

Implementations of image sensor devices may include a through-silicon-via (TSV) formed in a backside of an image sensor device and extending through a material of a die to a metal landing pad. The metal landing pad may be within a contact layer. The devices may include a TSV edge seal ring surrounding a portion of the TSV in the contact layer and extending from a first surface of the contact layer to the metal landing pad.

The TSV edge seal ring may be directly coupled to a diffusion barrier layer.

The TSV edge seal ring may be directly coupled to one or more shallow-trench-isolation (STI) regions.

Implementations of image sensor devices may include a first through-silicon-via (TSV) formed in an image sensor device extending from the backside of the image sensor device into a material of a die to a contact layer, a second TSV formed within the first TSV and extending into the material of the die to a metal landing pad, wherein the metal landing pad is within a contact layer, and a TSV edge seal ring within the contact layer surrounding the second TSV in the contact layer and extending from a first surface of the contact layer into the contact layer to a depth coextensive with a depth of the second TSV.

The TSV edge seal ring may include tungsten.

The TSV edge seal ring may be directly coupled to the metal landing pad.

The TSV edge seal ring may be physically isolated from the metal landing pad.

The device may include a pinning layer directly coupled to one or more sidewalls of the first TSV.

The device may include an anti-reflective layer coupled to one or more sidewalls of the first TSV.

A perimeter of the TSV edge seal ring may be aligned with a perimeter of the first TSV.

A perimeter of the TSV edge seal ring may be larger than a perimeter of the first TSV.

A perimeter of the TSV edge seal ring may be smaller than a perimeter of the first TSV.

The TSV edge seal ring may be directly coupled to a diffusion barrier layer.

The TSV edge seal ring may be directly coupled to one or more shallow-trench-isolation (STI) regions.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor devices, and implementing components and methods, consistent with the intended operation and methods.

Figure 1:
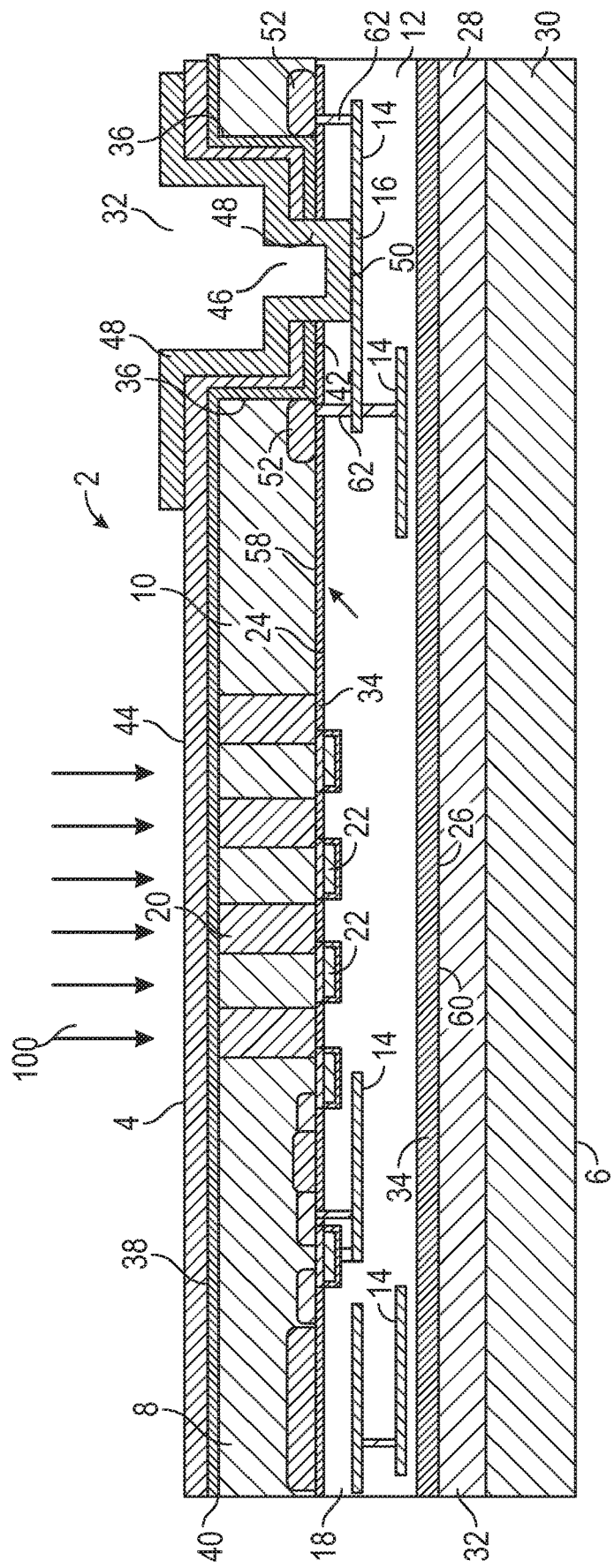
FIG. 1 is a cross-section side view of an image sensor device.

Referring to FIG. 1, a cross section side view of an image sensor device is illustrated. The image sensor device 2 includes a backside 4 and a front side 6. The image sensor device 2 may be configured to receive light from the backside of the device, as indicated by the arrows 100. The image sensor device includes a semiconductor die 8. In various implementations, the semiconductor die 8 includes a silicon layer 10. In other implementations, the semiconductor die 8 may include a layer having silicon dioxide, glass, silicon-on-insulator, gallium arsenide, sapphire, ruby, silicon carbide, polycrystalline or amorphous forms of any of the foregoing, and any other type of layer for constructing image sensor or semiconductor devices. In implementations including a silicon layer 10, the silicon layer may include a photodiode array 20 therein.

The image sensor device 2 includes a contact layer 12 having a first surface 24 and a second surface 26. In various implementations, the contact layer may be considered part of the semiconductor die 8, or it may be considered separate from but coupled to the semiconductor die 8. As used herein, the contact layer 12 is considered part of the semiconductor die 8 and is not considered separate from the material of the semiconductor die 8. In various implementations, the contact layer 12 may be an interlayer dielectric (ILD) material 18. The contact layer 12 may also include one or more metal layers 14 therein. The metal layers 14 may include one or more metal landing pads 16. In various implementations, the metal layers 14 and/or metal landing pads 16 may include aluminum, copper, tungsten, any other metal, and any combination thereof. In various implementations, the contact layer 12 may include one or more diffusion barrier layers 34. In particular implementations, the one or more diffusion barrier layers may be adjacent to the backside/first surface 58, and/or the front side/second surface 60. The diffusion barrier layer 34 may include SiN or any other material used in a diffusion barrier layer. The contact layer 12 may include other elements 22 therein, such as gates or other semiconductor elements. In various implementations, and as illustrated, the front side 26 of the contact layer 12 may be coupled to a second semiconductor die 28. The second semiconductor die 28 may include multiple layers therein, including layers 30 and 32. The second semiconductor die 28 may be the same as or similar to any type of semiconductor die disclosed herein or understood by one skilled in the art.

Still referring to FIG. 1, the semiconductor die 8 includes a first through-silicon-via (TSV) 32 extending from the backside 4 of the image sensor device 2 and into the silicon layer 10. In particular implementations, and as illustrated, the first TSV 32 may extend through the silicon layer 10 and to the contact layer 12. In various implementations, the first TSV 32 may also extend into the contact layer 12, and in certain implementations, may extend all the way to a metal landing pad. In various implementations, a pinning layer 38 may be coupled to the sidewalls 36 of the first TSV, a first surface 40 (or backside) of the semiconductor die 8, and/or to a portion of the base 42 of the first TSV 32. The pinning layer 38 may include, by non-limiting example, HfO$_2$, Ta$_2$O$_5$, or a combination thereof. The pinning layer may inhibit transfer of pinned voltage therethrough. In particular implementations, the pinning layer may be directly coupled to the sidewalls 36 of the first TSV, the first surface 40 of the semiconductor die 8, and/or to a portion of the base 42 of the first TSV 32.

In various implementations, an antireflective (AR) layer 44 may be coupled to the sidewalls 36 of the first TSV, a first surface 40 of the semiconductor die 8, and/or to a portion of the base 42 of the first TSV 32. The AR layer 44 may include, by non-limiting example, SiO$_2$ or any other material that acts to prevent reflection of light. In particular implementations, and as illustrated by FIG. 1, the AR layer 44 may be directly coupled over the pinning layer 38. In other implementations, the image sensor device may not include a pinning layer 38 and the AR layer 44 may be directly coupled to the sidewalls 36 of the first TSV, the first surface 40 of the semiconductor die 8, and/or to a portion of the base 42 of the first TSV 32. In implementations where the first TSV extends all the way to the metal landing pad, the image sensor device may not include more TSVs than the first TSV. In such implementations, a diffusion barrier layer may be coupled within the TSV and may be directly coupled to the metal landing pad.

In various implementations, and as illustrated by FIG. 1, the image sensor device 2 may include a second TSV 46. The second TSV 46 may be formed within the first TSV 32 (within the perimeter of the first TSV 32) and extends into the semiconductor die 8 material. As illustrated, the width of the second TSV 46 is less than the width of the first TSV 32. In various implementations, the second TSV 46 may extend partially through the silicon layer 10 if the first TSV 32 did not extend completely through the silicon layer. The second TSV 46 may also extend into the contact layer 12. In particular implementations, the second TSV 46 extends to the metal landing pad 16 within the contact layer 12. In various implementations, a metal layer 48 may be applied within the second TSV 46. The metal layer 48 may be any type of metallic diffusion barrier layer, including, by non-limiting example, Ti, TiN, Al, W, Cu, Ta, TaN, and any combination thereof. In such implementations, the metal layer 48 may be indirectly or directly coupled to the sidewalls of the second TSV 46 and/or the base 50 of the second TSV. The metal layer 48 may also serve as a mobile ion barrier, moisture barrier, hydrogen barrier, and as a barrier against any other contaminant entering the second TSV 46 or the material of the die itself. The metal layer 48 may also be coupled to a portion of the base 42 of the first TSV 32 and in implementations having a pinning layer 38 and/or AR layer 44, the metal layer may be coupled over the pinning layer and/or AR layer within the first TSV. The metal layer 48 may extend along a portion of the backside 4 of the image sensor device 2. In various implementations, a sealant may be used in place of the metal layer 48.

Still referring to FIG. 1, the image sensor device 2 may include one or more shallow trench isolation (STI) regions 52 within the semiconductor die 8. In various implementations, the STI regions 52 may be formed within the silicon layer 10. The STI regions 52 may be adjacent to or contact the sidewalls 36 of the first TSV 32. In particular implementations, the STI regions 52 may be formed adjacent to a corner formed between the sidewalls 36 of the first TSV 32 and the base 42 of the first TSV. In other implementations, the STI regions 52 may be formed below the first TSV 32. In other implementations, rather than STI regions, the semiconductor die 8 may include regions doped counter to the doping of the silicon layer 10. As an example, if the silicon layer 10 was P doped, the regions in place of the STI regions may be n or n+ doped.

The image sensor device 2 includes a TSV edge seal ring 62. The TSV edge seal ring 62 may be, by non-limiting example, tungsten, copper, silver, gold, any other metal, any other metal alloy, or any combination thereof. In particular implementations, the TSV edge seal ring 62 may be formed of tungsten. As illustrated, the TSV edge seal ring 62 is within the contact layer 12. In such implementations, the TSV edge seal ring 62 may surround the second TSV 46 in the contact layer 12. In other implementations, the TSV edge seal ring 62 may be partially within the silicon layer 10. In various implementations, the TSV edge seal ring may extend from a first surface 58 of the contact layer 12 into the contact layer to a depth coextensive with a depth of the second TSV 46. In similar implementations, the TSV edge seal ring 62 may extend from the base 42 of the first TSV, or a location coextensive with a depth of the base of the first TSV, to a depth coextensive with a depth of the second TSV 46. In particular implementations, the TSV edge seal ring may be directly coupled to the metal landing pad 16. The TSV edge seal ring may also be directly coupled to a diffusion barrier layer 34 and/or one or more STI regions 52. As illustrated by FIG. 1, and as later described in relation to FIG. 3, the perimeter of the TSV edge seal ring 62 may be larger than the perimeter of the first TSV. In such implementations, the STI regions 52 and/or the diffusion barrier layer 34 may cover the gap between the edge of the first TSV 32 and the TSV edge seal ring 62 in order to prevent ingress of any contaminants to the area immediately surrounding the interface between the second TSV 46 and the metal landing pad 16.

Figure 4:
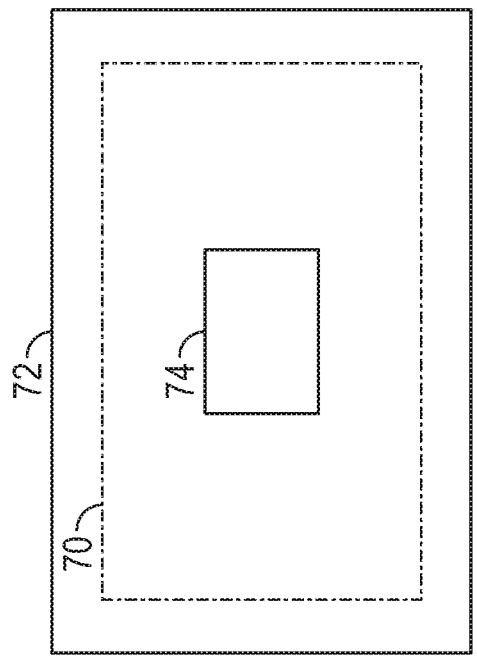
FIG. 4 is a top view of a portion of a second implementation of an image sensor device illustrating the relationship between a first through-silicon-via (TSV), a second TSV, and a TSV edge seal ring.
Figure 3:
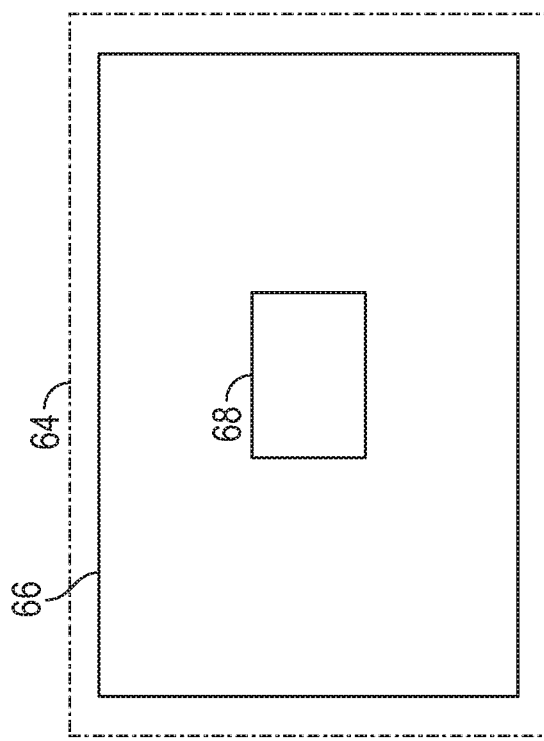
FIG. 3 is a top view of a portion of a first implementations of an image sensor device illustrating the relationship between a first through-silicon-via (TSV), a second TSV, and a TSV edge seal ring.

Referring to FIG. 3, a top view of a portion of a first implementation of an image sensor device illustrating the relationship between a first TSV, a second TSV, and a TSV edge seal ring is illustrated. The top view of FIG. 3 corresponds to FIG. 1 in that the TSV edge seal ring 64 has the largest perimeter, the first TSV 66 has a perimeter just smaller and within the perimeter of the TSV edge seal ring 64, and the second TSV 68 has the smallest perimeter and is located in the center of the first TSV 64. In various implementations, the distance between the perimeters of the TSV edge seal ring 64, the first TSV 66, and the second TSV 68 may vary, however, in particular implementations, and as illustrated, the perimeter of the first TSV 66 is made only slightly smaller than the perimeter of the TSV edge seal ring 64 in order to allow space for a small barrier (STI region or diffusion barrier layer) between the perimeter of the TSV edge seal ring and the perimeter of the first TSV. Referring to FIG. 4, a top view of a portion of a second implementation of an image sensor device illustrating the relationship between a first TSV 72, a second TSV 74, and a TSV edge seal ring 70 is illustrated.

Figure 5:
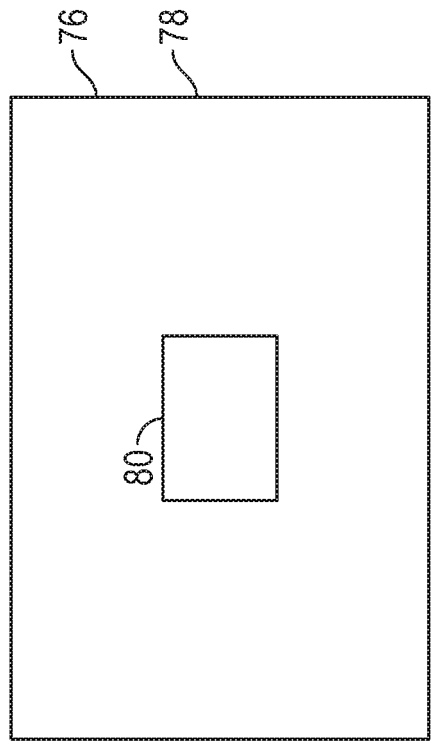
FIG. 5 is a top view of a portion of a third implementation of an image sensor device illustrating the relationship between a first through-silicon-via (TSV), a second TSV, and a TSV edge seal ring.

Contrary to FIG. 3, in various implementations, the perimeter of the first TSV 72 may be larger than the perimeter of the TSV edge seal ring 70, and the perimeter of the TSV edge seal ring 70 may be larger than the perimeter of the second TSV 72. In the implementation illustrated by FIG. 4, the TSV edge seal ring 70 is formed below the first TSV 72. As illustrated by FIG. 4, the TSV edge seal ring 70 is located closer to the perimeter of the first TSV 72 and further from the perimeter of the second TSV 74, however, in other implementations the TSV edge seal ring may be located anywhere between the perimeter of the first TSV 72 and the perimeter of the second TSV 74. Referring to FIG. 5, a top view of a portion of a third implementation of an image sensor device illustrating the relationship between a first TSV 76, a second TSV 80, and a TSV edge seal ring 78 is illustrated. In various implementations, the perimeter of the first TSV 76 may be the same size and shape as the perimeter of the TSV edge seal ring 78. In such implementations, the perimeter of the first TSV 76 may line up with the perimeter of the TSV edge seal ring 78. Similar to the implementation illustrated by FIG. 4, the TSV edge seal ring 78 may be formed under the edge of the first TSV 76. The perimeter of the second TSV 80 may be smaller than the perimeter of the first TSV 76 and the TSV edge seal ring 78.

In implementations having only a single TSV that extends to the metal landing pad, the TSV edge seal ring may surround the portion of the TSV in the contact layer. In such implementations, the perimeter of the TSV edge seal ring is greater than the perimeter of the first TSV. An STI region and/or diffusion barrier layer may cover the gap, if a gap exists, between the TSV and the TSV edge seal ring. Thus, in either implementations with a single TSV or implementations with a first and second TSV, the TSV edge seal ring 62 provides a barrier for the interface between the TSV coupled to the metal landing pad and the metal landing pad 16. Specifically, the TSV edge seal ring 62 may serve as a barrier to, by non-limiting example, moisture, mobile ions, and hydrogen.

Figure 2:
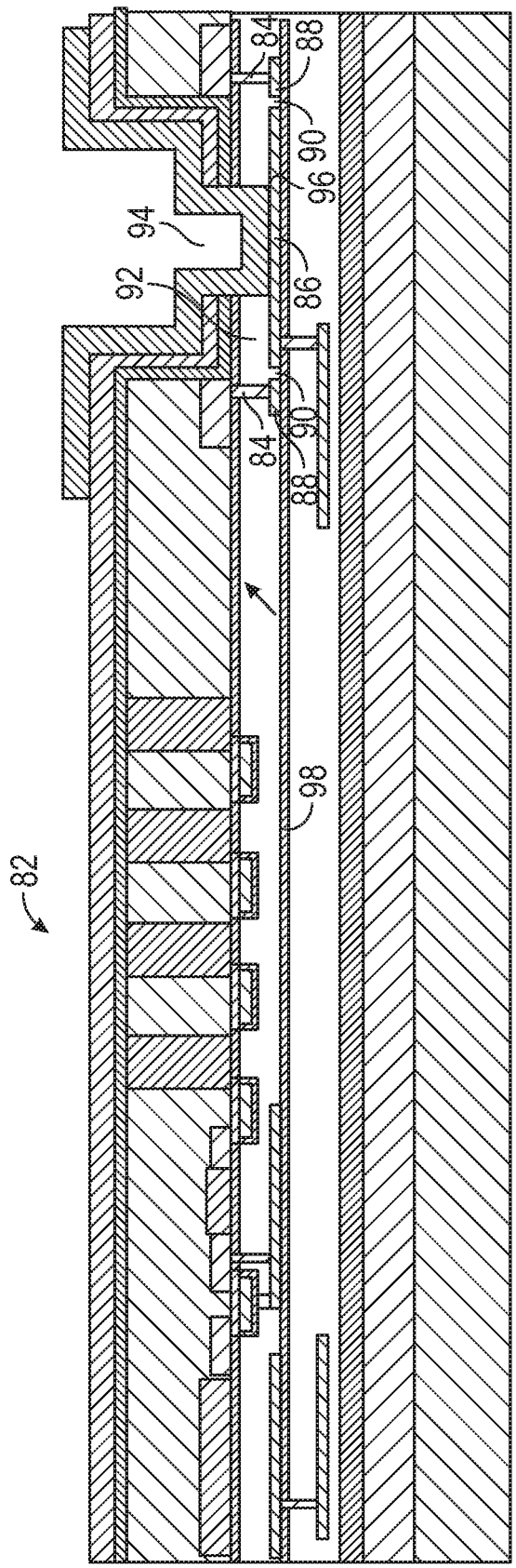
FIG. 2 is a cross-section side view of another implementation of an image sensor device.

Referring to FIG. 2, a cross-section side view of another implementation of an image sensor device is illustrated. The image sensor device 82 is similar to the image sensor device 2 of FIG. 1. The primary difference is that the TSV edge seal ring 84 is physically isolated from the material of the metal landing pad 86. As illustrated in FIG. 2, the TSV edge seal ring 84 is directly coupled to one or more metal pads 88. One or more gaps 90 physically isolate the one or more metal pads 88, and in turn, the TSV edge seal ring 84, from the metal landing pad 86. In such implementations, in order to inhibit the ingress of moisture, hydrogen, ions, or other contaminants into the area 92 immediately surrounding the interface 96 between the second TSV 94 and the metal landing pad 86, the image sensor device may include an additional diffusion barrier layer 98. The diffusion barrier layer 98 may be any type of diffusion barrier layer disclosed herein. The diffusion barrier layer 98 may be directly coupled to the metal landing pad 86 and one or more metal pads 88. The diffusion barrier layer 98 may also be a barrier to prevent ingress of contaminants through the one or more gaps 90.

In various implementations, a method of forming the image sensor device of FIG. 1 or FIG. 2 may include forming the desired metal layers, metal landing pads, diffusion barrier layers, TSV edge seal ring, and any other elements in the contact layer (which may be an ILD). In various implementations, the TSV edge seal ring may be directly coupled to, and may even be the same material, as the metal landing pad. In particular implementations, the TSV edge seal ring may be formed as a single continuous piece with the metal landing pad. In other implementations, the TSV edge seal ring may be physically isolated from the metal landing pad, similar to the implementation illustrated in FIG. 2. The method may include coupling a wafer to the contact layer. The wafer may include a silicon layer (or any other die/wafer material previously disclosed herein) having a photodiode array to the contact layer. The wafer may also include a plurality of STI or counter doped regions. In various implementations, the method includes thinning the wafer from the backside of the wafer to a desired thickness. The wafer then may be patterned and a TSV may be formed in the wafer. In implementations having STI or counter doped regions, the edge of the TSV may be configured to border such regions. The TSV is formed from the backside of the device. The width and length of the TSV may be configured to allow the perimeter of the TSV to be smaller and fit within a perimeter of the TSV edge seal ring, to be larger and surround a perimeter of the TSV edge seal ring, or to line up with a perimeter of the TSV edge seal ring. The TSV may be formed through the silicon layer (or other wafer material). In various implementations (such as implementations having two TSVs), the TSV does not extend into the contact layer, however, in other implementations the TSV does extend into the contact layer and may even extend to a metal landing pad within the contact layer. The method may include depositing a pinning layer over the backside of the wafer and within the TSV. The pinning layer may coat the sidewalls and the base of the TSV. Similarly, the method may include depositing an AR layer over the backside of the wafer and within the TSV. The AR layer may be deposited over the pinning layer in implementations having a pinning layer.

In implementations where the TSV does not extend to the metal landing pad, the method may include patterning the base of the existing TSV and forming a second TSV therein. The second TSV in various implementations may have a smaller width than the existing first TSV and may extend into the contact layer (and through the pinning layer and AR layer if they exist) and to the metal landing pad. In various implementations, the method may include forming a diffusion barrier layer within the second TSV. The diffusion barrier layer may also coat the inside of the first TSV and may extend over onto a backside of the wafer in addition to coating the base and sidewalls of the second TSV.

In various implementations, a backside metal may be coupled to the backside of the image sensor device, such as, by non-limiting example, copper, silver, gold, aluminum, nickel, tungsten, or any other metal, metal alloy, or combination thereof. The method includes singulating the wafer. The singulated image sensor devices (or the wafer before singulation) may be hydrogen annealed.

In places where the description above refers to particular implementations of image sensor devices and implementing components, sub-components, methods and sub-methods, it should be readily apparent that a number of modifications may be made without departing from the spirit thereof and that these implementations, implementing components, sub-components, methods and sub-methods may be applied to other image sensor devices.

What is claimed is:

1. An image sensor device comprising:
    a first through-silicon-via (TSV) formed in an image sensor device extending from the backside of the image sensor device into a material of a die to a contact layer;
    a second TSV formed within the first TSV and extending into the material of the die to a metal landing pad, wherein the metal landing pad is within the contact layer; and
    a TSV edge seal ring within the contact layer surrounding the second TSV in the contact layer and extending from a first surface of the contact layer into the contact layer to a depth coextensive with a depth of the second TSV.

2. The image sensor device of claim 1, wherein the TSV edge seal ring comprises tungsten.

3. The image sensor device of claim 1, wherein the TSV edge seal ring is directly coupled to the metal landing pad.

4. The image sensor device of claim 1, wherein the TSV edge seal ring is physically isolated from the metal landing pad.

5. The image sensor device of claim 1, further comprising a pinning layer directly coupled to one or more sidewalls of the first TSV.

6. The image sensor device of claim 1, further comprising an anti-reflective layer coupled to one or more sidewalls of the first TSV.

7. The image sensor device of claim 1, wherein a perimeter of the TSV edge seal ring is aligned with a perimeter of the first TSV.

8. The image sensor device of claim 1, wherein a perimeter of the TSV edge seal ring is larger than a perimeter of the first TSV.

9. The image sensor device of claim 1, wherein a perimeter of the TSV edge seal ring is smaller than a perimeter of the first TSV.

10. The image sensor device of claim 1, wherein the TSV edge seal ring is directly coupled to a diffusion barrier layer.

11. The image sensor device of claim 1, wherein the TSV edge seal ring is directly coupled to one or more shallow-trench-isolation (STI) regions.

* * * * *